United States Patent
Barina et al.

(10) Patent No.: US 7,957,149 B2
(45) Date of Patent: Jun. 7, 2011

(54) TOP ACTUATED, FORCE LIMITING HEATSINK RETENTION SYSTEM

(75) Inventors: Richard Barina, Sebring, FL (US);
Bruce Desrosiers, Oxford, NC (US);
Michael French, Raleigh, NC (US);
David L. Hager, Wake Forest, NC (US);
Michael S. June, Raleigh, NC (US);
John P. Scavuzzo, Cary, NC (US); Scott Womble, Hillsborough, NC (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 12/543,872

(22) Filed: Aug. 19, 2009

(65) Prior Publication Data

US 2011/0044008 A1 Feb. 24, 2011

(51) Int. Cl.
*H05K 7/20* (2006.01)

(52) U.S. Cl. ........ 361/720; 361/707; 361/710; 257/719; 165/80.3; 174/16.3

(58) Field of Classification Search .................. 361/704, 361/707, 709, 710, 717, 719, 720, 727
See application file for complete search history.

(56) References Cited

U.S. PATENT DOCUMENTS

| | | | | |
|---|---|---|---|---|
| 3,946,276 A * | 3/1976 | Braun et al. | .................. | 361/699 |
| 5,946,191 A | 8/1999 | Oyamada | | |
| 6,137,298 A * | 10/2000 | Binns | ..................... | 324/750.02 |
| 6,201,697 B1 * | 3/2001 | McCullough | ................ | 361/704 |
| 6,350,950 B1 | 2/2002 | Barbier et al. | | |
| 6,449,152 B1 * | 9/2002 | Lin | .............................. | 361/697 |
| 6,671,184 B1 | 12/2003 | Barringer et al. | | |
| 6,674,643 B2 | 1/2004 | Centola et al. | | |
| 6,816,382 B2 | 11/2004 | Barringer et al. | | |
| 6,898,083 B1 * | 5/2005 | Hornung | ...................... | 361/704 |
| 6,978,827 B2 * | 12/2005 | Armstrong | ................... | 165/80.3 |
| 7,142,430 B2 * | 11/2006 | Lee et al. | ...................... | 361/719 |
| 7,239,520 B2 | 7/2007 | Barsun | | |
| 7,327,573 B2 * | 2/2008 | Lee et al. | ...................... | 361/704 |

(Continued)

OTHER PUBLICATIONS

PCT/EP2010/061681, "PCT—International Search Report and Written Opinion", dated Jan. 25, 2011, Applicant: International Business Machines Corporation, 9 pages.

*Primary Examiner* — Jayprakash N Gandhi
*Assistant Examiner* — Courtney Smith
(74) *Attorney, Agent, or Firm* — Thomas E. Tyson; Jeffrey L. Streets

(57) ABSTRACT

Apparatus for securing or retaining a heatsink. The heatsink retention apparatus includes a heatsink module that cooperates with first and second spring loaded latches secure to a circuit board on opposing sides of a heat-generating component. The heatsink module includes a handle pivotally secured to opposing sides of the heatsink body, and bails pivotally secured to the handle. In addition, the bails extend downward to dispose a lower bail member adjacent the spring loaded latches. As the handle pivots between a first position to raise the bails and a second position to lower the bails, the bails automatically move from a locked position to an unlocked position. Each of the spring loaded latches include a hook and at least one pre-loaded spring to transfer a minimum downforce to the lower bail members when the bails are raised. Accordingly, embodiments may be operated from the top of the heatsink without the use of tools, while providing a desired downforce over a range of heatsink heights.

19 Claims, 6 Drawing Sheets

U.S. PATENT DOCUMENTS

| | | | |
|---|---|---|---|
| 7,495,919 B2 * | 2/2009 | Li | 361/710 |
| 7,663,887 B2 * | 2/2010 | Li | 361/720 |
| 2003/0142478 A1 | 7/2003 | Huang et al. | |
| 2005/0219823 A1 | 10/2005 | Yu et al. | |
| 2005/0259399 A1 | 11/2005 | Delprete et al. | |
| 2007/0103870 A1 * | 5/2007 | Li et al. | 361/704 |
| 2008/0144289 A1 | 6/2008 | Desrosiers et al. | |
| 2008/0305670 A1 | 12/2008 | Gattuso et al. | |

* cited by examiner

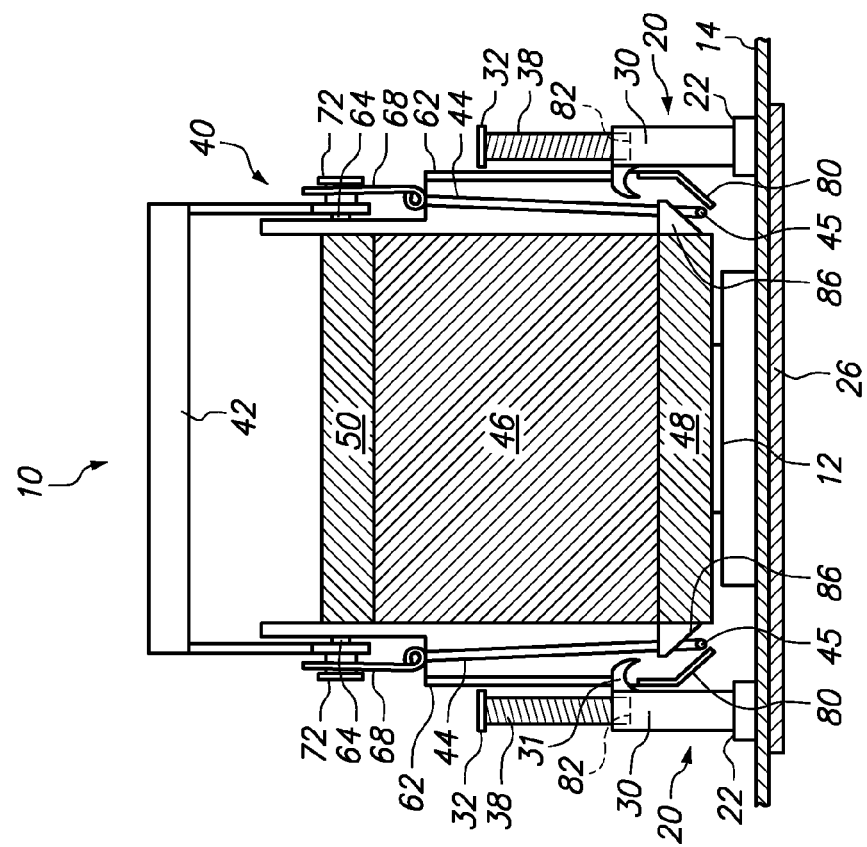
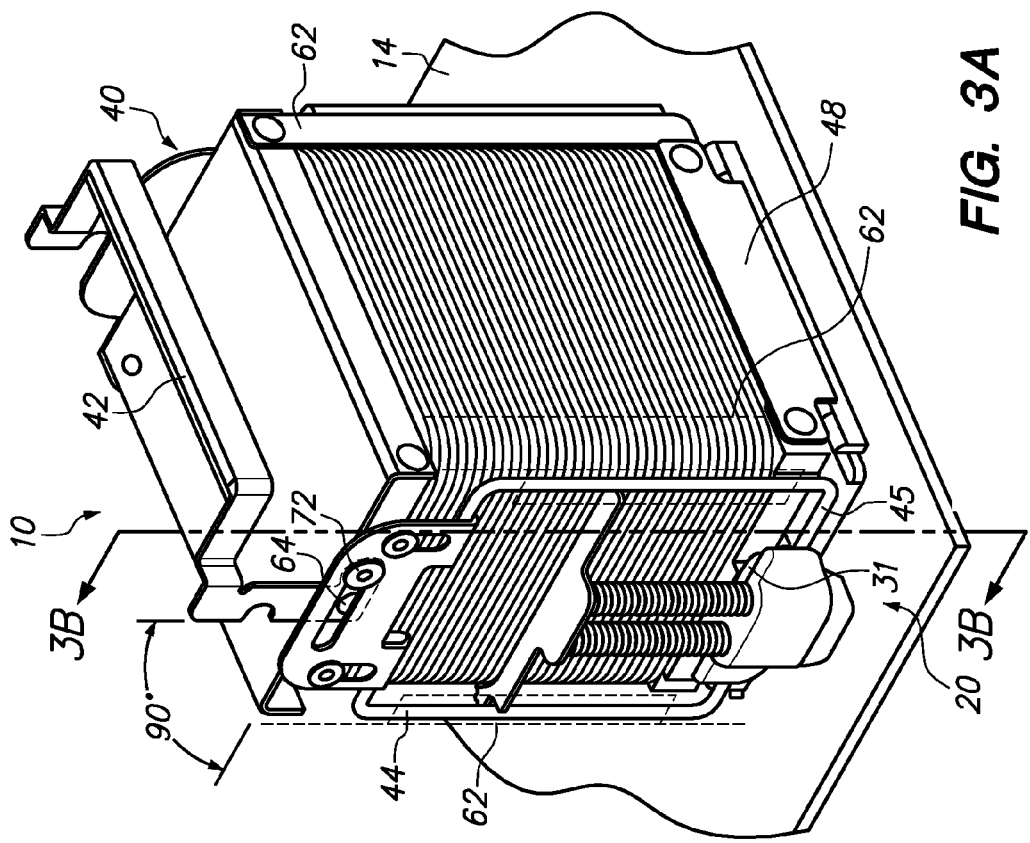
FIG. 3A
FIG. 3B

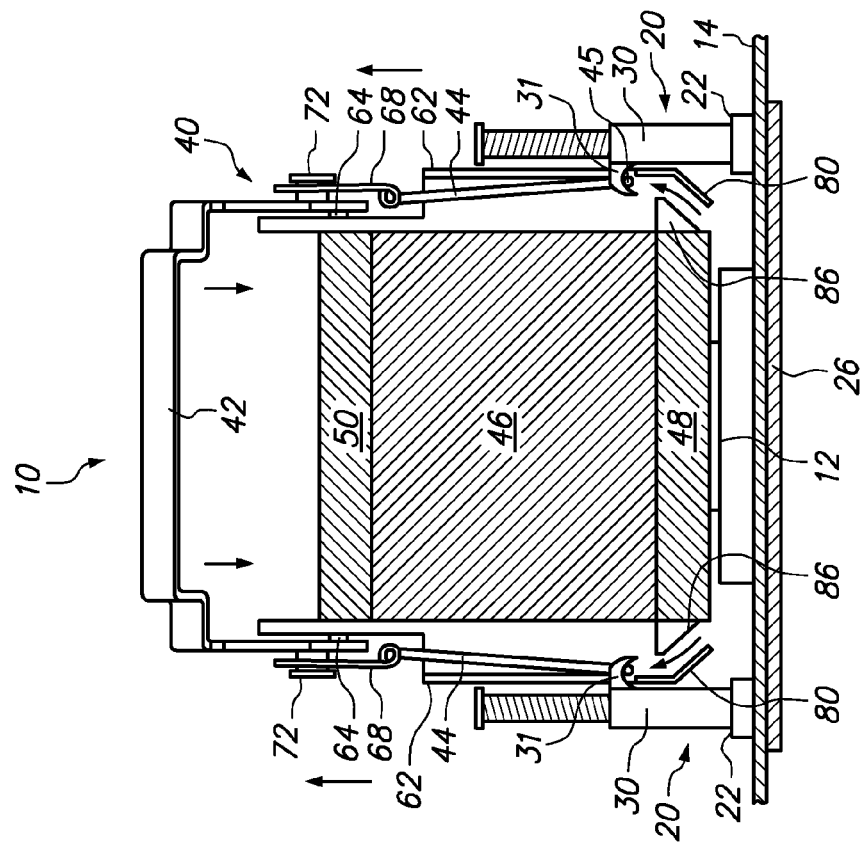
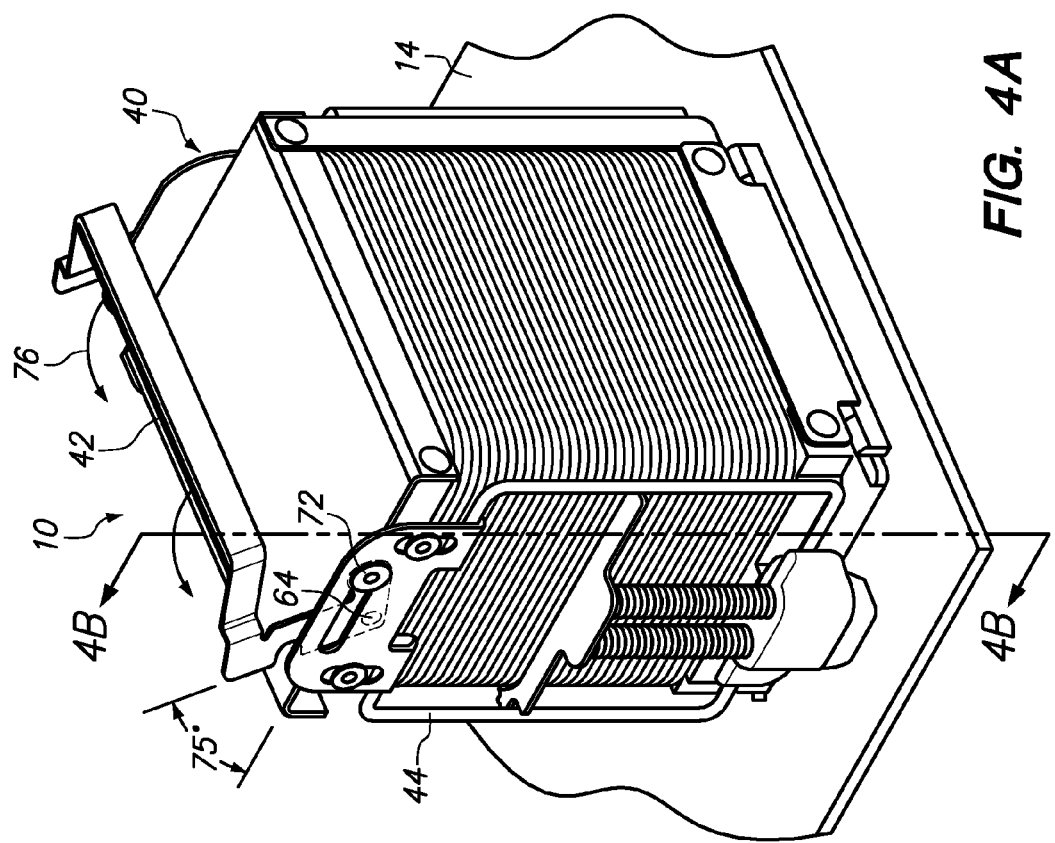
FIG. 4A
FIG. 4B

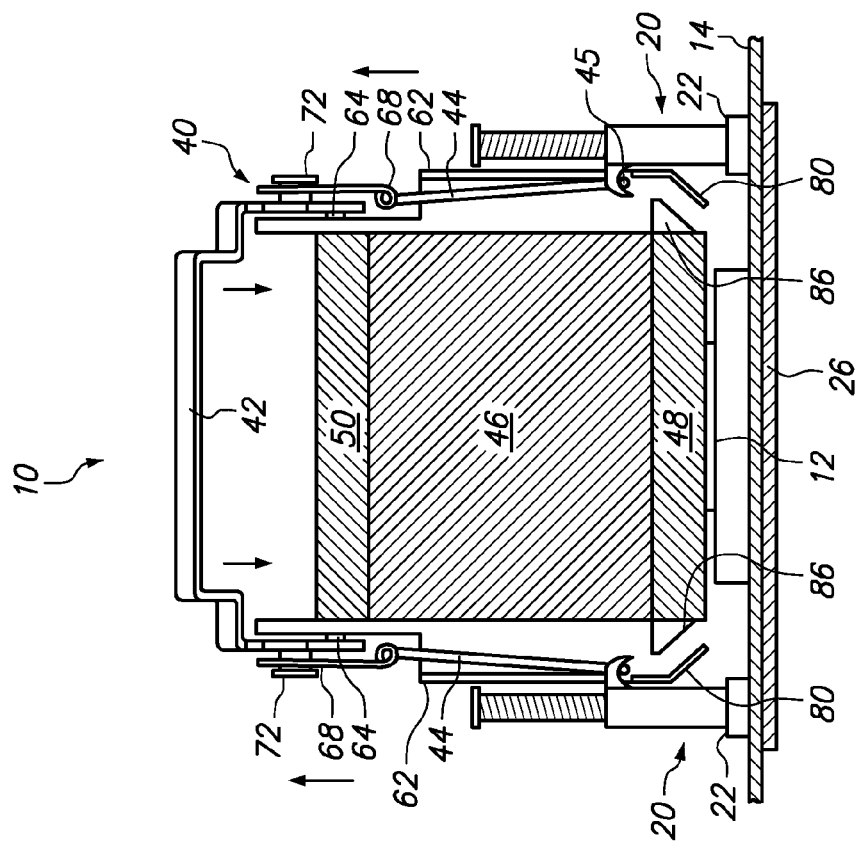
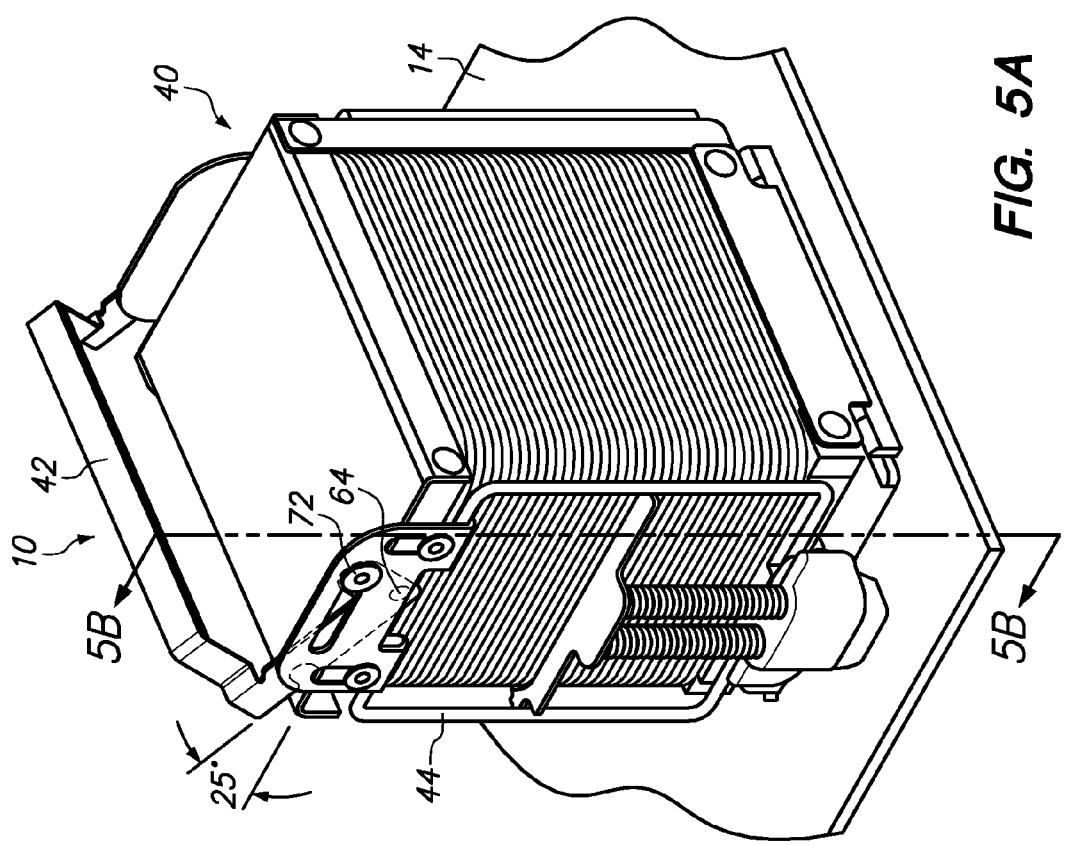

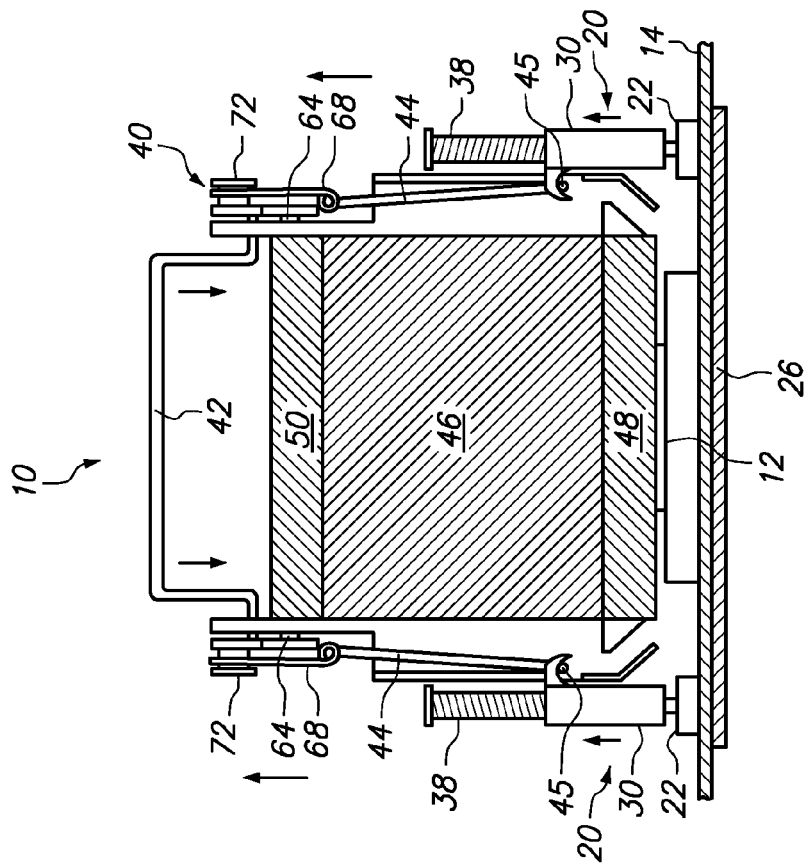
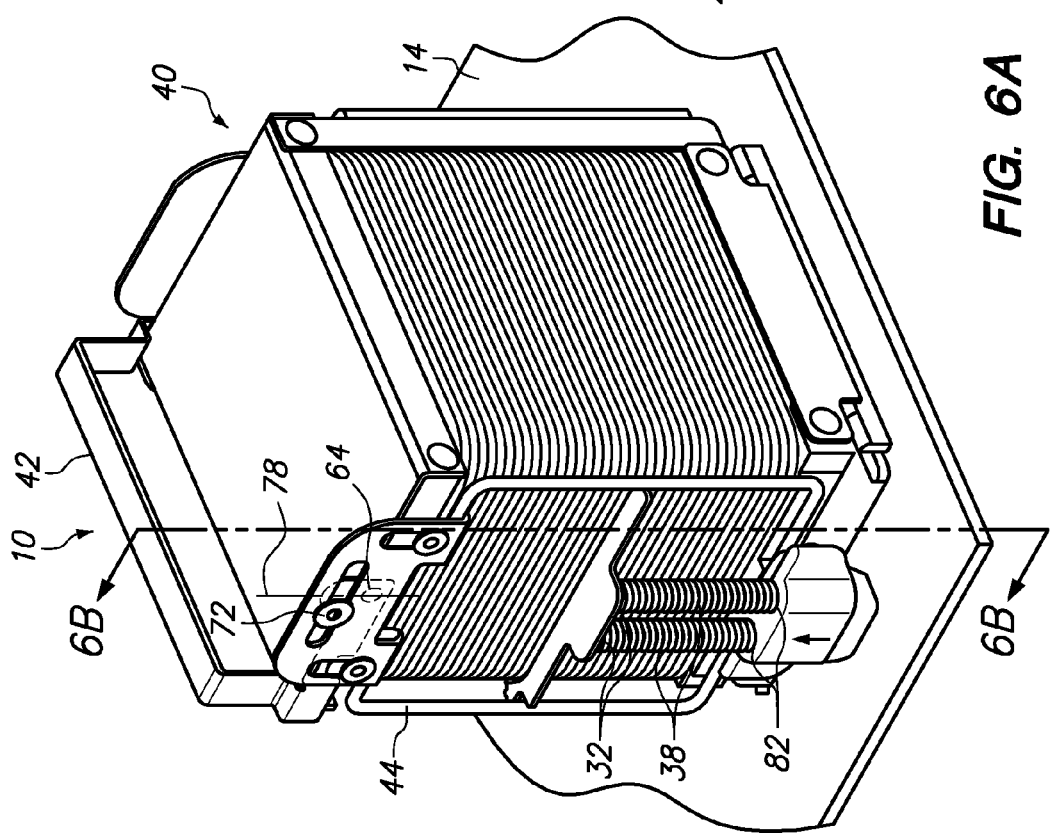
FIG. 6A
FIG. 6B

US 7,957,149 B2

TOP ACTUATED, FORCE LIMITING HEATSINK RETENTION SYSTEM

BACKGROUND OF THE INVENTION

1. Field of the Invention

The present invention relates to heatsink retention systems, and more specifically to tool-less, top-actuated, force limiting heatsink retention systems.

2. Background of the Related Art

A heatsink is commonly used to cool a heat-generating component in electronic equipment, such as a computer system, by transferring thermal energy from the heat-generating component to second object or medium, such as ambient air, at a lower temperature. For example, a processor, such as a central processing unit ("CPU"), generates a considerable amount of heat, and must be reliably cooled to remain operational and prevent damage to the CPU. Accordingly, a variety of methods and devices have been developed for securing a heatsink to a circuit board. The heatsink should be secured in a manner that ensures positive engagement between the heatsink and the heat-generating component to be cooled.

High performance computer systems and server systems include increasingly complex, high signal speed, integrated circuit devices or microprocessors secured to printed circuit boards to accommodate efficient electronic interconnections within a small spatial footprint. These electronic interconnections are commonly made using a land grid array (LGA) that provides high density, mechanically loaded interconnects between the microprocessor and the printed circuit board. The LGA allows for reliable and efficient interconnection, test and replacement of very costly module configurations while circumventing the inherent reliability and process limitations associated with soldering of large area array packages. Yet, the interconnection of a land grid array of a microprocessor to a printed circuit board involves a high area density of electronic contacts that must be highly reliable over a range of operating environments.

Variations in the mechanical load placed on the electronic contacts of the land grid array should be minimized. Such variations have been reduced by using springs to uniformly distribute the applied load and backing plates to provide support to the back side of the printed circuit board. These mechanical systems may also be responsible for the support of heatsinks in direct contact with the microprocessor to support cooling of the microprocessor during operation. Efficient thermal conduction from the processor to the heat sink depends upon uniform contact and mechanical load being applied across the interface between these two components.

Still, the demand for precise positioning, loading, and cooling of microprocessors can be at odds with efforts to provide higher performance in less space. For example, the layout of devices on the printed circuit board must consider spatial interference between adjacent components on the board, as well other adjacent components within the same enclosure. Furthermore, heatsinks and their attachment devices must avoid consuming excessive real estate on the printed circuit board and must work efficiently without employing dimensions that would unduly enlarge the enclosure.

BRIEF SUMMARY OF THE INVENTION

One embodiment of the present invention provides an apparatus comprising a heatsink module that cooperates with first and second spring loaded latches. The heatsink module comprising a heatsink body, a handle pivotally secured to first and second opposing sides of the heatsink body, and first and second bails pivotally secured to the handle on the first and second opposing sides of the heatsink body. In addition, the first and second bails extend downward along the first and second opposing sides of the heatsink body to dispose a lower bail member adjacent a base of the heatsink body. The handle pivots between a first position to raise the bails and a second position to lower the bails. In accordance with one embodiment, the first and second spring loaded latches are secured to a circuit board on opposing sides of a heat-generating component. The first spring loaded latch includes a hook disposed for selectively engaging the lower bail member of the first bail and the second spring loaded latch includes a hook disposed for selectively engaging the lower bail member of the second bail. Each of the first and second spring loaded latches include at least one pre-loaded spring to transfer a minimum downforce to the lower bail members when the bails are raised.

BRIEF DESCRIPTION OF THE SEVERAL VIEWS OF THE DRAWINGS

FIGS. 3A-B are perspective and partial cross-sectional side views of a heatsink module in a position to be secured to a circuit board with the handle fully raised.

FIGS. 4A-B are perspective and partial cross-sectional side views of the heatsink module of FIGS. 3A-B with the handle partially lowered so that the wire bail initially engages a hook on the spring loaded base.

FIGS. 5A-B are perspective and partial cross-sectional side views of the heatsink module of FIGS. 4A-B with the handle lowered further so that the wire bail has been flexed.

FIGS. 6A-B are perspective and partial cross-sectional side views of the heatsink module of FIGS. 5A-B with the handle fully lowered so that the springs in the spring loaded base compress to allow the latch body to lift off from the base and apply a predetermined force between the heatsink module and the processor.

DETAILED DESCRIPTION OF THE INVENTION

Figure 1:
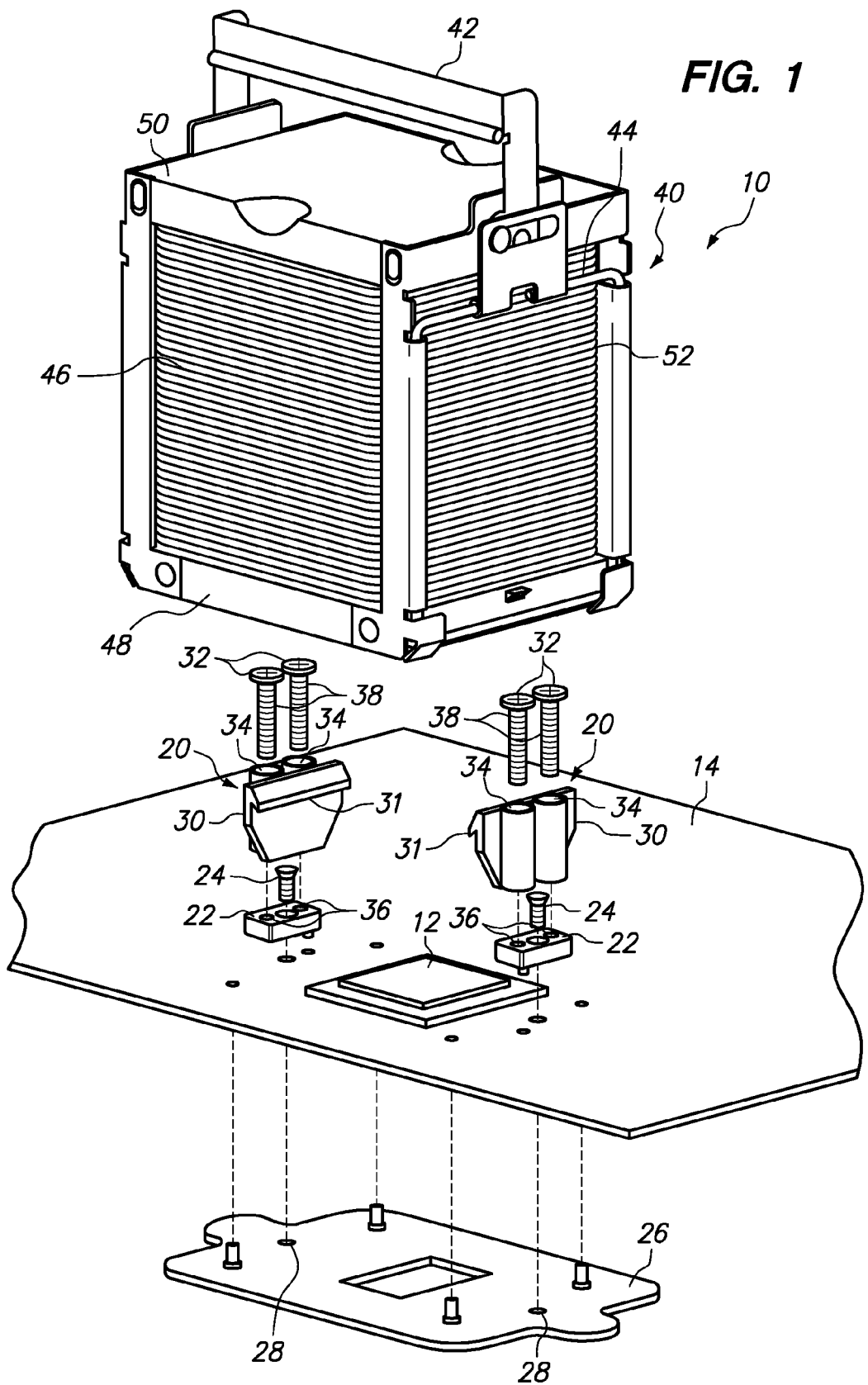
FIG. 1 is an assembly view of one embodiment of a heatsink retention system for use with a processor secured to a circuit board.

One embodiment of the present invention provides a heatsink retention system or apparatus comprising a heatsink module that cooperates with first and second spring loaded latches. The heatsink module comprising a heatsink body, a handle pivotally secured to first and second opposing sides of the heatsink body, and first and second bails pivotally secured to the handle on the first and second opposing sides of the heatsink body. In addition, the first and second bails extend downward along the first and second opposing sides of the heatsink body to dispose a lower bail member adjacent a base of the heatsink body. The handle pivots between a first position to raise the bails and a second position to lower the bails.

The first and second spring loaded latches are secured to a circuit board on opposing sides of a heat-generating component. Optionally, the first and second spring loaded latches are secured to the circuit board using a backing plate disposed below the circuit board and a fastener that extends through the circuit board to engage the backing plate. The first spring loaded latch includes a hook disposed for selectively engaging the lower bail member of the first bail and the second spring loaded latch includes a hook disposed for selectively engaging the lower bail member of the second bail. Each of the first and second spring loaded latches include at least one pre-loaded spring to transfer a minimum downforce (i.e., clamping force) to the lower bail members when the bails are raised. Alternatively, the first and second spring loaded latches may each include at least two pre-loaded springs.

In another embodiment, the first and second bails each comprise an upper bail member extending laterally along a top of the heatsink body, a pair of side bail members extending vertically downward from the upper bail member along a side edge of the heatsink body, and the lower bail member extending laterally along the base of the heatsink body between the pair of side bail members. Optionally, the first and second bails may be wire bails. Preferably, the first and second bails do not block air flow through a major portion of the heatsink body.

In yet another embodiment of the apparatus, guide rails are secured to the heatsink body along the side edges to guides a side bail member for vertical movement. The guide rails may be individually secured or a pair of guide rails may be formed in a unitary component, optionally extending across a top edge of the heatsink body. In a further option, each guide rail may have a lower end that is angled down and toward the heatsink body to direct the lower bail members inwardly and out of vertical alignment with the hooks as the bails are lowered. With the lower bail members moved inwardly, the heatsink module may be removed or installed without the lower bail members hitting or snagging on the hooks.

In a still further embodiment, the apparatus may include a deflector coupled to the heatsink body and angled up and away from the heatsink body to direct the lower bail members outwardly and into vertical alignment with the hooks as the bail are raised. Accordingly, raising the bails will automatically cause them to engage the hooks so as to retain the heatsink body. The only way to remove the heatsink body is to lower the bails.

In another embodiment of the invention, the handle is pivotally secured about a pivot point, and wherein the first and second bails are pivotally secured to the handle at a position that is overcenter of the handle pivot point. Because the bails engage the spring loaded latch when raised, the bails pull downward on at the position where they are pivotally secured to the handle. By securing the bails at a position that is overcenter of the handle pivot point, the downward force tends to retain the handle in the closed or latched position. However, this downward force may be overcome by hand in order to release or unlock the handle and lower the bails.

Although various handles may be implemented in accordance with the invention, it is preferable that the handle is generally horizontal in the first position (to raise the bails) and the handle is generally vertical in the second position (to lower the bails). Accordingly, the handle may form a handhold for lifting the heatsink module when the handle is in the second position. Since the second position forms the handhold and also lowers the bails, the handhold is available for installing and removing the heatsink module only when the module is unlocked from the spring loaded latches. It is also preferable if the handle lies flat against a top surface of the heatsink body when the handle is in the first position, because the handle will not take up much space or interfere with adjacent components.

Embodiments of the present invention may be used to secure or retain various types and sizes of heatsink bodies. However, the present heatsink retention system may be particularly advantageous for securing a large heatsink, such as a heatsink with horizontal fins, since the height of the heatsink may vary over a wider range. Unlike heatsink retention systems that secure the heatsink base, the present heatsink retention system is operable from the top of the heatsink such that the overall height of the heatsink can affect the operation of the retention system. The present invention is tolerant of variation in heatsink height alone or in combination with variations in the height of the heat-generating component upon which the heatsink is seated.

Embodiments of the present invention provide various ways in which height tolerance may be provided. For example, the bails may have a vertical length that disposes the lower bail member below the hooks when the bails are lowered, wherein the vertical length is sufficient to accommodate a heatsink body having a height within a given range. Furthermore, the handle may pivot from the second (raised) position to the first (lowered) position to raise the bails from below the hooks, engage with the hooks, flex the bails, and lift off the latch body from a seated position. Preferably, each spring has sufficient pre-load so that when the latch body lifts off, the base the springs provide at least a minimum downforce. Furthermore, it is preferable that each spring has sufficient length and low spring rate so the when the latch body is at the maximum lift off height, the base springs provide less than a maximum downforce.

It should be appreciated that the preloaded springs provide the present invention with a "force limiting" feature. The springs that pre-load the latches preferably have a relatively low spring rate compared to the spring rate of the wire bails, such as less than about 2 lbf/mm. The "spring rate," as that term is used herein, refers to the change in the force that a spring exerts, divided by the change in deflection of the spring. Accordingly, the force exerted by a spring having a relatively low spring rate will change very little as the spring is compressed. Accordingly, such springs will accommodate variations in heat sink height and processor elevation without applying more than the maximum force.

The springs are preferably pre-loaded so that once the wire bails engage the hooks, any further raising of the wire bails will cause the interface force to rapidly increase until the latches lift off (further compressing the low spring rate springs). Thus, as long as the spring loaded latches "lift-off," then a minimum downforce can be guaranteed (the pre-load). If the latches are raised a further distance, however, the interface force will experience only a negligible increase, so that the downforce will not exceed a value much higher than the pre-load.

In one example, a heatsink retention system may incorporate a total of four springs with each spring having a relatively low spring rate of about 1 lbf/mm (1 pound force per millimeter). Optionally, these four springs may collectively provide a total preload force of about 50 lbs of force. Accordingly, if a worst case maximum tolerance condition caused the latches to lift 3 mm, then this 3 mm lift would result in an interface force 62 lbf. [50 lbf+(1 lbf/mm)*(3 mm)*(4 springs)= 62 lbf].

The handle pivots about a handle pivot point near the top of the heatsink body and the bails pivot about a bail pivot point on the handle. Optionally, the distance between the handle pivot point and the bail pivot point is sufficient, and the orientation there between is configured, to raise the lower bail members to a height that is sufficient to lift the hooks from a seated position and accommodate a heatsink body having a height within a given range.

As will be understood by those having ordinary skill in the art, embodiments of the present invention may be implemented in systems having intense space limitations where access to the board level heatsink interface is limited and the retention system must be operable from the top of the heatsink. Embodiments of the present invention may also provide a consistent clamping force generation despite the heatsink having a variable height, perhaps over a specified range, tolerances, or standards. Although most system address heatsink height variations by securing the heatsink base rather than the top, the retention system embodiments may be secured and operated from the top of the heatsink. Embodiments of the invention may also be installed and removed without the use of tools.

Furthermore, embodiments of the retention system may use opposing springs that ensure a minimum clamping force is always reached, yet limit that force from exceeding preset maximum limits due to tolerance build-up conditions. This control over the amount of clamping downforce is independent of the height of the heatsink over a range of heights. The bail has a built in closure interference that is designed to also provide the minimum down force at almost the lowest tolerance build-up (i.e., the height of the heatsink is at the bottom of the range). In that condition, the springs would experience little compression, and only a slight lift off such that the preload of the springs is still overcome. The bail interference should be set such that the preload is always overcome, even in a "low" tolerance condition. Accordingly, the spring loaded latch still establishes the minimum downforce that the system will deliver. However, if the height of the heatsink is greater because of mechanical part tolerance stack up (i.e., the height of the heatsink is at the top of the range), the bail will rise higher in accordance with the heatsink height, rapidly increasing the force that the bail applies to the hooks beyond the minimum preset. Although the linear coil springs in the spring loaded latch will exceed their preload and be compressed further, the overall downforce is limited to a small rise above the minimum downforce. This will give a much more controlled clamping force on the processor with a more narrow range than can be achieved by a single spring system with no preloaded element. It also allows more tolerance to be accommodated.

FIG. 1 is an assembly view of one embodiment of a heatsink retention system 10 for use with a processor 12 secured to a circuit board 14. First and second spring loaded latches 20 are secured to the circuit board 14 on opposing sides of the processor 12 or other heat generating component. As shown, a base 22 is secured with a fastener 24, such as a screw, that extends through the base 22 and circuit board 14 to engage a backing plate 26, such as in a threaded hole 28. Then, a latch body 30 is secured to the base 22 using a pair of screws 32 that extend through channels 34 in the latch body and threadably engage the holes 36 in the base 22. About each screw 34 that secured the latch body is a linear coil spring 38 that becomes captured between the head of the screw 34 and a shoulder within the latch body. In this manner, the screw is threadably advanced into the base so that the spring is partially preloaded to provide a minimum downforce or resistance to being lifted. Still, the range of motion in the spring allows the latch body to lift a distance above the base while being retained and guided by the shaft of the screws. The latch body 30 includes a hook 31 that faces inwardly toward the processor 12 in order to secure a heatsink module 40, as described below.

A heatsink module 40 is aligned above the processor 12 and between the first and second spring loaded latches 20. The heatsink module 40 may be lifted and lowered using the handle 42 as a convenient handhold and should be oriented so that first and second bails 44 (only one is shown in FIG. 1) are directed toward the first and second spring loaded latches 20, respectively. A heat sink body 46, here including a heatsink base 48 and a heatsink top 50, provides a plurality of thermally conducting fins 52 allowing for the passage of air there between.

Figure 2:
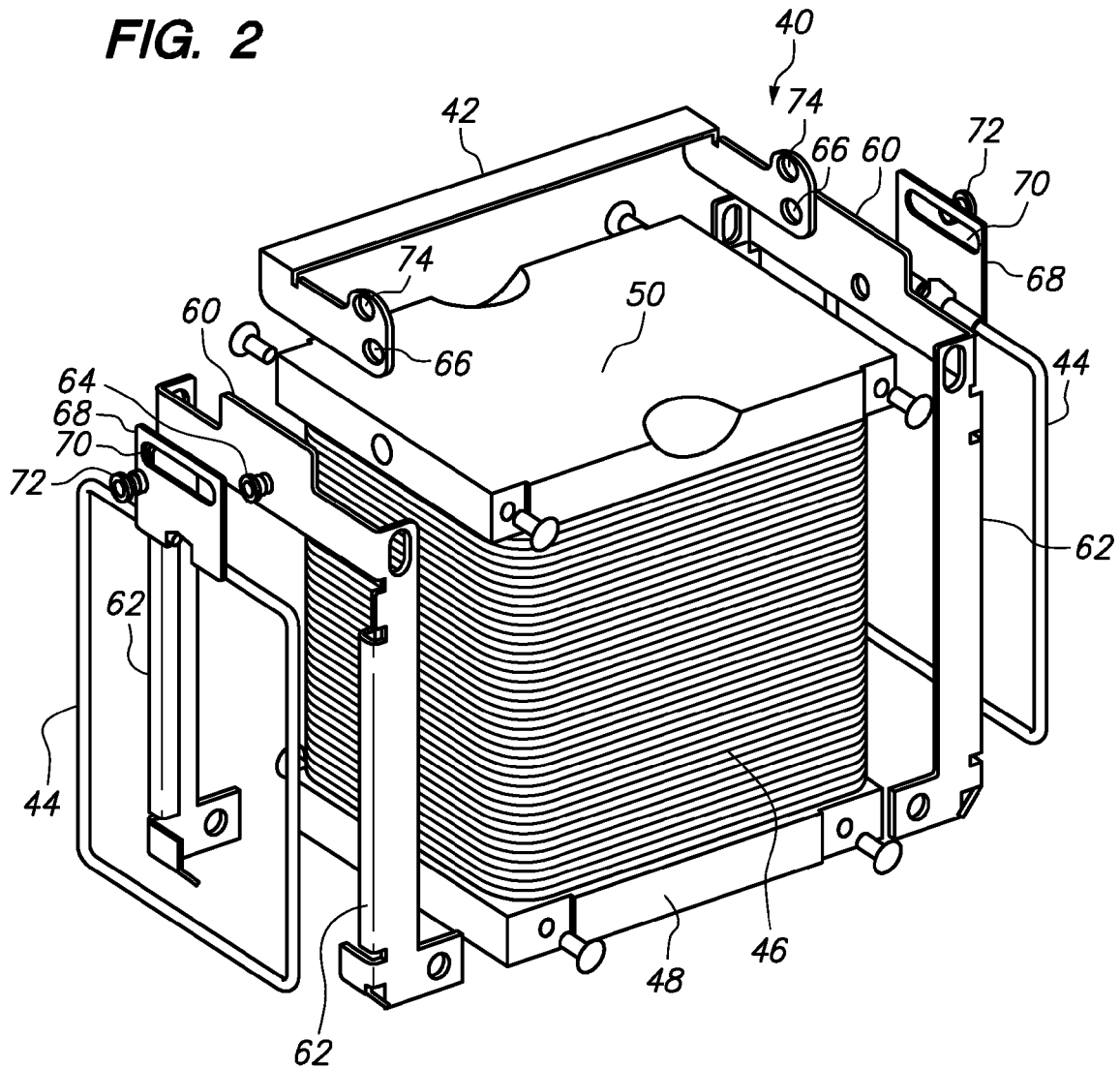
FIG. 2 is an exploded perspective view of a heatsink module that is included in the heatsink retention system.

FIG. 2 is an exploded perspective view of the heatsink module 40 that is included in the heatsink retention system. The heatsink module 40 includes various components secured to the heatsink body 46, preferably by attachment only the heatsink base 48 and heatsink top 50. It is also preferable that the components do not block airflow from entering any substantial amount of the heatsink fins. Although FIG. 2 is an exploded perspective view of the heatsink module 40, the following description, in combination with the remaining figures and the descriptions thereof, will fully describe the construction of one embodiment of a heatsink module.

The heatsink module 40 has a handle 42 that spans across the top of the heatsink body 46 to be pivotally secured. The utility of the handle 40 and the components on opposing sides of the heatsink body 46 are the same. Therefore, the following description is equally applicable to the components on either or both sides of the heatsink module. A bracket 60 includes a pair of guide rails 62 that are secured between the heatsink top 50 and the heatsink bottom 48 for example with screws. A pivot pin or screw 64 extends through the handle pivot hole 66 and the bracket 60 and is secured to the heatsink top 50.

The wire bail 44 is vertically moveable, laterally restrained, and partially protected behind a portion of the vertical guide rail 62. At the top of the bail 44, a transition plate 68 is secured to the bail 44 and includes a horizontal slot 70. A bail pivot pin 72 is then received through the horizontal slot 70 and also through a bail pivot hole 74 in the end of the handle 42. Pivoting the handle 42 about its pivot pin 64 moves the bail pivot about the same pivot point so as to raise and lower the bails.

FIG. 3A is a perspective view of the heatsink module 40 in a position to be secured to the circuit board 14 with the handle fully raised (i.e., forming a 90° angle from the plane of the circuit board). The heatsink base 48 is in thermal communication with the processor (not shown) and conducts thermal energy throughout the heatsink fin structure. With the handle 42 still raised, the bail pivot pin 72 is at its lowest elevation relative to the handle pivot pin 64 so that the transition plate 68 is lowered and a lower bail member 45 is positioned lower than the hook 31. The left side bail 44 (right side bail is hidden behind the heat sink) is laterally restrained by the two guide rails 62 (shown in dashed lines to reveal the wire bail). Furthermore, the guide rails 62 prevent any outward movement of the bails 44 and direct the bails 44 downward so that the lower bail member 45 will engage an angled plate 80 that inwardly directs the lower bail member 45. With the lower bail member 45 in this lower, retracted position, the heatsink module 40 may be installed or removed without interference between the bail 44 and the spring loaded latch 20.

Each spring 38 is secured between the head of the screw 32 and a shoulder 82 formed in the latch body and preloaded by advancing the screw 32 into the base 22 a sufficient distance to begin compressing the spring 38. Still, the spring 38 should have sufficient length that is may compress further while providing an appropriate downforce.

FIG. 3B is a partial cross-sectional side view of the heatsink module 40 in the same position as in FIG. 3A. This view shows that the heat sink 46 has its base 48 in contact with the processor 12 as necessary for cooling. The overall height of the heat sink body 46 and the heat sink top 50 may vary, yet the raised handle 42 lowers the bail pivot pins 72 so that the lower bail members 45 are positioned lower than the hooks 31 and directed inwardly to avoid interference with the hooks 31 when the module 40 is raised and lowered into the position shown. Furthermore, the fasteners 32 extend through the springs 38 and couple to each base 22 so that the latch body 30 is held down with a pre-loaded force. The hooks 31 are inwardly directed and positioned to engage the lower bail members 45 when they are raised. An angled tab 86 is secured to the heat sink base 48 in order to push the bail members 45 outward into vertical alignment with the hook 31.

FIGS. 4A-B are perspective and partial cross-sectional side views of the heatsink module of FIGS. 3A-B, respectively, with the handle 42 partially lowered (i.e., about a 75° from horizontal) to raise the bail pivot pins 72 so that the lower bail members 45 move along the angle tabs 86 and initially engages the hooks 31 on each spring loaded latch body 30. Note that the springs 38 are not compressed beyond their pre-load condition, and the latch body 30 is still seated on the base 22. Although FIGS. 4A-B show the lower bail members 45 making contact with the hooks 31 are precisely the same handle position, the system 10 will accommodate minor side-to-side variations in heatsink height and/or minor variations in side-side bail length, since lowering of the handle 42 will ultimately cause each bail/latch pair to engage and apply the preload force, albeit at the same or slightly different angle of the handle.

FIGS. 5A-B are perspective and partial cross-sectional side views of the heatsink module of FIGS. 4A-B, respectively, with the handle 42 lowered further (i.e., about a 25° angle from horizontal) so that the wire bail 44 has been flexed. As the handle 42 is moved from an angle of 75° to an angle of 25°, for example, the bail 44 flexes to cause a gradual increase in the downforce applied to the processor 12. Still, as shown, the force applied by the flexing bail has not yet reached the amount of the preload force, such that springs 38 are not compressed beyond their pre-load condition, and the latch body 30 is still seated on the base 22. It should be noted that the elevation of the bail pivot pins 72 is greater in FIG. 5B than in FIG. 4B, yet the latch body 30 has not yet moved because the bail 44 has elongated as it flexes.

FIGS. 6A-B are perspective and partial cross-sectional side views of the heatsink module of FIGS. 5A-B, respectively, with the handle 42 fully lowered (i.e., in the horizontal position) so that the springs 38 compress and allow the latch body 30 to lift off from the base 22, forming a gap between the body 30 and the base 22. As a result of the lift off, the springs 38 apply a predetermined preload force between the heatsink module and the processor.

The handle 42 and the position of the bail pivot pin 72 relative to the position of the handle pivot pin 64 are preferably configured so that the pivot pin 72 rotates over and slightly past a point vertically above the pivot pin 64 (i.e., vertical relative to the plane of the circuit board 14). As shown, the center of the bail pivot pin 72 has rotated just "overcenter" of a vertical centerline 78 passing through the pivot pin 64. In this overcenter position, the handle 42 will remain in the lower position (locked) unless someone forcibly raises the handle.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
   a heatsink module comprising a heatsink body, a handle pivotally secured to first and second opposing sides of the heatsink body, and first and second bails pivotally secured to the handle on the first and second opposing sides of the heatsink body, wherein the first and second bails extend downward along the first and second opposing sides of the heatsink body to dispose a lower bail member adjacent a base of the heatsink body, and wherein the handle pivots between a first position to raise the bails and a second position to lower the bails; and
   first and second spring loaded latches secured to a circuit board on opposing sides of a heat-generating component, wherein the first spring loaded latch includes a hook disposed for selectively engaging the lower bail member of the first bail and the second spring loaded latch includes a hook disposed for selectively engaging the lower bail member of the second bail, and wherein the first and second spring loaded latches each include at least one pre-loaded spring to transfer a minimum downforce to the lower bail members when the bails are raised.

2. The apparatus of claim 1, wherein the first and second bails each comprise an upper bail member extending laterally along a top of the heatsink body, a pair of side bail members extending vertically downward from the upper bail member along a side edge of the heatsink body, and the lower bail member extending laterally along the base of the heatsink body between the pair of side bail members.

3. The apparatus of claim 2, wherein the first and second bails are wire bails.

4. The apparatus of claim 2, wherein the first and second bails do not block air flow through a major portion of the heatsink body.

5. The apparatus of claim 2, further comprising:
   guide rails secured to the heatsink body along the side edges, wherein each guide rail guides a side bail member for vertical movement.

6. The apparatus of claim 5, wherein each guide rail has a lower end that is angled down and toward the heatsink body to direct the lower bail members inwardly and out of vertical alignment with the hooks as the bails are lowered.

7. The apparatus of claim 6, further comprising:
   a deflector coupled to the heatsink body and angled up and away from the heatsink body to direct the lower bail members outwardly and into vertical alignment with the hooks as the bail are raised.

8. The apparatus of claim 1, wherein the first and second spring loaded latches are secured to the circuit board using a backing plate disposed below the circuit board.

9. The apparatus of claim 1, wherein the handle is pivotally secured about a pivot point, and wherein the first and second bails are pivotally secured to the handle at a position that is overcenter of the handle pivot point.

10. The apparatus of claim 1, wherein the first position of the handle is generally horizontal and the second position of the handle is generally vertical.

11. The apparatus of claim 10, wherein the handle forms a handhold for lifting the heatsink module when the handle is in the second position.

12. The apparatus of claim 11, wherein the handle lies flat against a top surface of the heatsink body when the handle is in the first position.

13. The apparatus of claim 1, wherein the first and second spring loaded latches each include at least two pre-loaded springs.

14. The apparatus of claim 1, wherein the heat sink body comprises horizontal fins.

15. The apparatus of claim 1, wherein the bails have a vertical length that disposes the lower bail member below the hooks when the bails are lowered, and wherein the vertical length is sufficient to accommodate a heatsink body having a height within a given range.

16. The apparatus of claim 15, wherein pivoting the handle from the second position to the first position raises the bails from below the hooks, into engagement with the hooks, and lifts the hooks from a seated position.

17. The apparatus of claim 16, wherein the handle pivots about a handle pivot point and the bails pivot about a bail pivot point, and wherein the distance between the handle pivot point and the bail pivot point is sufficient to raise the lower bail members to a height that lifts the hooks from a seated position and accommodate a heatsink body having a height within a given range.

18. The apparatus of claim 16, wherein the at least one spring has sufficient length to provide at least the minimum downforce and less than a maximum downforce when the bails are raised.

19. The apparatus of claim 1, wherein the first and second bails are flexible.

* * * * *